United States Patent [19]
Kikuchi

[11] Patent Number: 6,069,927
[45] Date of Patent: May 30, 2000

[54] DIGITAL SIGNAL LINK

[75] Inventor: Hidekazu Kikuchi, Kanagawa, Japan

[73] Assignee: Sony Corporation, Tokyo, Japan

[21] Appl. No.: 08/968,447

[22] Filed: Nov. 12, 1997

[30] Foreign Application Priority Data

Nov. 15, 1996 [JP] Japan ..................................... 8-305012

[51] Int. Cl.$^7$ .................................................... H04L 7/00
[52] U.S. Cl. .......................... 375/357; 375/358; 375/362; 370/503; 713/400; 714/798
[58] Field of Search .................... 375/358, 357, 375/376, 375, 362; 370/503, 516, 517, 518; 713/400; 714/798

[56] References Cited

U.S. PATENT DOCUMENTS

| 4,110,558 | 8/1978 | Kageya et al. .......................... 178/69.1 |
| 4,757,521 | 7/1988 | Korsky et al. ............................ 375/109 |
| 4,829,524 | 5/1989 | Yoshida ..................................... 371/32 |
| 5,159,465 | 10/1992 | Maemura et al. ....................... 358/405 |
| 5,506,531 | 4/1996 | Jang et al. ............................... 327/156 |

Primary Examiner—Amanda T. Le
Assistant Examiner—Dac V. Ha
Attorney, Agent, or Firm—Ronald P. Kananen; Rader, Fishman & Grauer

[57] ABSTRACT

A digital signal transmission apparatus, wherein at the time of normal data transmission, an output circuit of a transmitter unit selects transmission data SDAT and converts it to a differential signal for output to the transmission line, while a clock recovery circuit of the receiver unit generates a clock signal LCK matching the frequency of the transmission clock signal TCK and receives the signal based on the same. When the clock signal LCK and the received signal deviate in frequency, the clock reproduction circuit outputs a common mode reference clock request signal to the transmission line. In accordance with this, the transmitter unit selects the reference clock signal RCK for output to the transmission line. The clock recovery circuit of the receiver unit uses this to make the frequency of the clock signal LCK match the transmission clock signal. As a result, it is possible to handle a wide range of transmission rates, it is possible to quickly track a transmission clock when a reproduced clock signal deviates from a transmission clock signal, and it is possible to simplify the circuit configuration and reduce the space taken by the transmission line.

21 Claims, 4 Drawing Sheets

DIGITAL SIGNAL LINK

BACKGROUND OF THE INVENTION

1. Field of the Invention

The present invention relates to a data transmission apparatus, more particularly to a serial data transmission apparatus for transferring serial data at high speeds.

2. Description of the Related Art

Serial data transmission enables transmission of a signal by one or two transmission media, so is superior in terms of saving space. Further, it is free from the problem of skew (deviation in timing) occurring between data when transmitting a signal by a multicore signal transmission line, so is suited to long distance data transmission.

FIG. 1 is a view showing the configuration of a general serial data transmission apparatus. The illustrated data transmission apparatus is comprised of a transmitter unit 10, a transmission line 20, and a receiver unit 30. The transmitter unit 10 is in turn comprised of a parallel/serial conversion circuit 11 and a transmission clock generating circuit 12, while the receiver unit 30 is comprised of a serial/parallel conversion circuit 31 and a clock recovery circuit 32.

The transmission line 20 is comprised of a pair of signal lines, for example, a shield twisted pair (STP) or an unshielded twisted pair (UTP).

At the time of transmitting data, the for example n bits of transmission data input to the transmitter unit 10 is converted to serial data by the parallel/serial conversion circuit 11 in synchronization with the transmission clock signal TCK and output to the transmission line 20.

The transmission clock generating circuit 12 is for example comprised of a PLL circuit. It receives the synchronization clock signal CLK and in accordance with the same generates the transmission clock signal TCK which it outputs to the parallel/serial conversion circuit 11.

The receiver unit 30 receives the serial data transmitted from the transmission line 20 and converts it to n bits of data by the serial/parallel conversion circuit 31 for output.

The clock recovery circuit 32 is for example comprised of a PLL circuit. It reproduces a reception clock signal LCK having the same frequency as the transmission clock signal TCK based on the transmission data of the transmission line 20 and supplies it to the serial/parallel conversion circuit 31.

Using the above data transmission apparatus, the transmission data can be transmitted over the pair of transmission paths at a high speed and the space taken by the transmission line can be reduced. Further, there is little distortion of the data and long distance data transmission can be realized.

The above mentioned data transmission apparatus of the related art, however, suffers from the problem that the receiver unit 30 requires a circuit for extracting a clock signal from the transmission data in order to accurately receive the data transmitted from the transmitter unit 10, that is, a clock recovery circuit 32.

The clock recovery circuit 32 can be comprised of a band pass filter or PLL circuit having a high Q value.

When configuring the clock recovery circuit 32 by a band pass filter, the typical method used is to filter the differentiated signal of received signal by a surface acoustic wave (SAW) filter etc. to extract the clock signal. With this method, there is the restriction that it cannot be applied to transmission rates other than the center frequency of the SAW filter.

When configuring the clock recovery circuit 32 by a PLL circuit, the clock signal is extracted by controlling the phase of the received signal and the phase of the output of the voltage controlled oscillator (VCO) to be equal. With this method, there is the advantage that it is possible to handle a variety of data transmission rates by widening the range of oscillation frequencies of the VCO.

When the frequency of the VCO deviates widely from the frequency of the reception signal, however, the phase comparing means, which is designed envisioning a serial data signal of a random bit stream, becomes confused. The VCO then drifts or is locked to a frequency of a whole multiple of the transmission rate and it becomes impossible to accurately extract the transmission clock signal TCK.

To deal with the above problems, the method adopted has been to give to the receiver unit 30 a reference clock signal having a frequency of a specific ratio with the rate of the transmitted signal to lock the PLL circuit in the initialized state of the receiver unit 30. Even with this method, however, when the transmission rate of the serial data transmitted by the transmitter is not known, it is not possible to set the frequency of the reference clock signal, so a separate means becomes necessary for transmitting information relating to the transmission rate.

SUMMARY OF THE INVENTION

An object of the present invention is to provide an effective clock extracting means by a simple circuit configuration and to provide a data transmission apparatus able to handle a wide range of transfer rates, enabling the reproduced clock signal to quickly track the transmission clock, and not requiring an increased number of transmission media.

To achieve the above object, the present invention provides a data transmission apparatus for transmitting transmission data through a transmission line from a transmitter unit to a receiving unit by a transfer rate set by a transmission clock signal, recovering a transmission clock signal at the receiving unit based on the received signal, and receiving the above transmission data, wherein the transmission line comprises a pair of signal lines; the transmitter unit has an output circuit which converts the transmission data to a pair of complementary signals, outputs them to the transmission line, and outputs a reference clock signal to the transmission line instead of the transmission data in response to a request signal from the receiving unit transmitted over the transmission line; and the receiving unit has a clock recovery circuit for generating a clock signal in response to the reference clock signal or transmission data transmitted over the transmission line and a request signal output circuit for outputting the request signal to the transmission line as a common mode signal in accordance with a result of comparison of a frequency of the clock signal generated by the clock recovery circuit and a signal frequency of the transmission line.

Preferably, the output circuit of the transmitter unit is provided with a detection circuit for generating a selection control signal in accordance with the signal transmitted over the transmission line and a selection circuit for selecting one of the transmission data and the reference clock signal in accordance with the selection control signal. More preferably, the detection circuit makes the selection circuit select and output the transmission data when a synchronization signal is not being transmitted over the transmission line and makes the selection circuit select and output the reference clock signal when a synchronization signal is being transmitted over the transmission line.

Preferably, the transmitter unit has a differential drive circuit for outputting the transmission signal in accordance with a differential signal of the transmission line and of a lock detection circuit for detecting a deviation in frequency of the clock signal generated by the clock recovery circuit and the received signal.

Preferably, the receiver unit has a common mode drive circuit for outputting a common mode signal of a request clock request signal to the transmission line when the lock detection circuit detects deviation between the frequency of the clock signal generated by the clock recovery circuit and the frequency of the reception signal.

According to the present invention, the transmitter unit converts the transmission data to a complementaly signal which it then outputs to a transmission line by a transmission rate set by the transmission clock signal, while the receiver unit recovers a transmission clock signal in response to the received signal and receives the signal from the transmission line triggered by recovered clock signal.

The receiver unit, for example, recovers the transmission clock by a clock recovery circuit comprised of a PLL circuit. When the frequency of the recovered clock signal and the frequency of the transmission clock signal differ, a common mode request signal requesting transmission of the reference clock signal is output to the transmission line. Receiving this, the transmitter unit outputs the reference clock signal to the transmission line. The receiver unit performs control in response to the reference clock signal so that the frequency of the recovered transmission clock signal matches the frequency of the transmission clock signal.

As a result, it is possible, with a simple circuit configuration, to handle a wide range of transfer rates, enable the recovered clock signal to quickly track the transmission clock when deviated from the transmission clock signal, and transmit data at a high speed and transmit a request signal for a reference clock without requiring an increased number of transmission media.

BRIEF DESCRIPTION OF THE DRAWINGS

These and other objects and features of the present invention will become more apparent from the following description of the preferred embodiments given with reference to the attached drawings, in which.

DESCRIPTION OF THE PREFERRED EMBODIMENTS

Preferred embodiments of the present invention will be explained in detail below with reference to the attached drawings.

Figure 1:
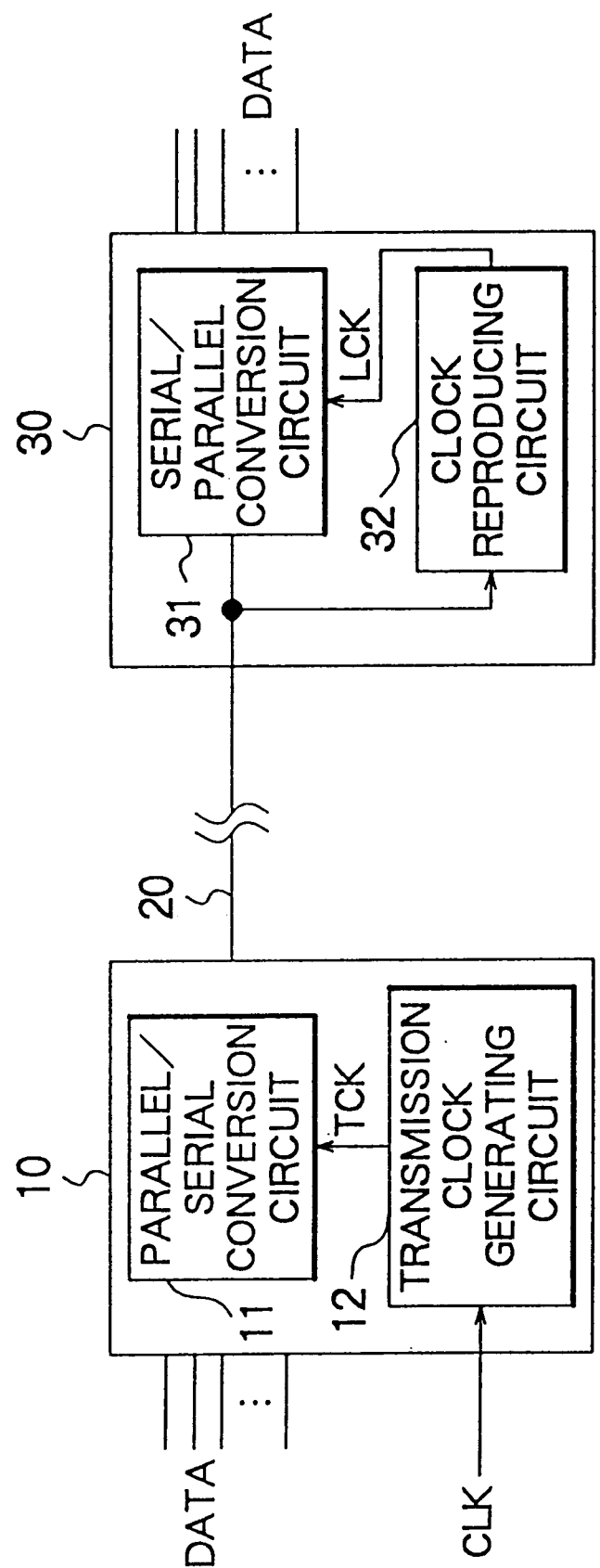
FIG. 1 is a circuit diagram showing the configuration of a serial data transmission apparatus of the related art.
Figure 2:
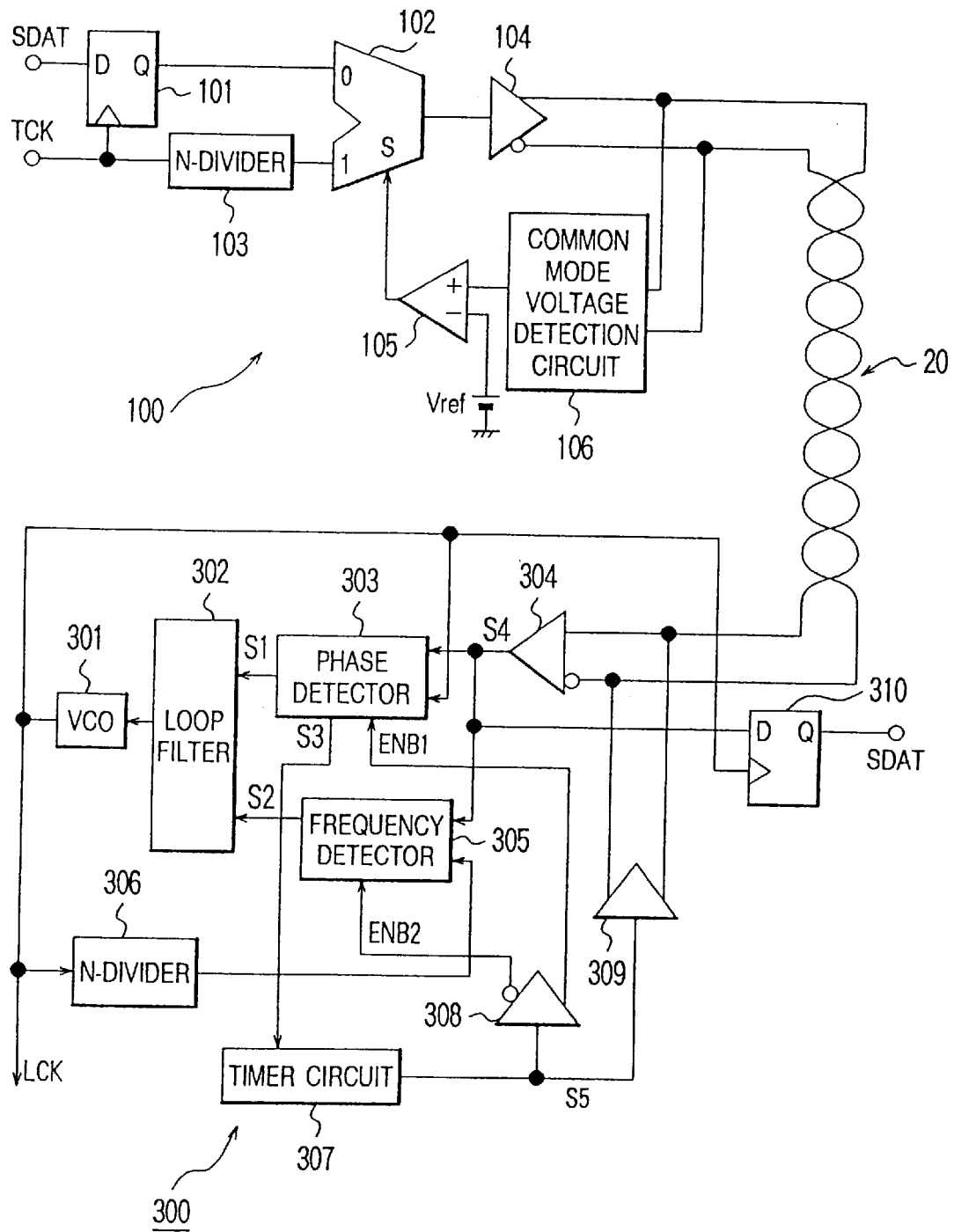
FIG. 2 is a circuit diagram of a data transmission apparatus according to a first embodiment of the present invention.

FIG. 2 is a circuit diagram of a data transmission apparatus according to a first embodiment of the present invention.

In FIG. 2, 100 is a circuit for outputting transmission data and a reference clock signal in a transmitter unit. Reference numeral 300 is a clock recovery circuit in a receiver unit.

The output circuit 100 is comprised of a D-type flip-flop 101, selector 102, frequency divider 103, differential driver 104, comparator 105, and common mode voltage detection circuit 106.

The transmission clock signal TCK from the transmission clock generating circuit (not illustrated in FIG. 2) of the transmitter unit is input to the clock signal input terminal of the flip-flop 101, while a serial transmission data SDAT from the parallel/serial conversion circuit (not illustrated in FIG. 2) of the transmitter unit is input to the data input terminal. Therefore, the transmission data is successively output from the flip-flop 101 and input to the input terminal 0 of the selector 102 at the timings of the clock signal TCK.

The frequency divider 103 divides the transmission clock signal TCK in frequency by N (N is a positive integer) and inputs the frequency divided signal as the reference clock signal RCK to the input terminal 1 of the selector 102.

The selector 102 selects and outputs the signal input to either of the input terminal 0 or input terminal 1 in accordance with the level of the selection control signal input to the selection signal terminal S.

For example, when a high level selection control signal is input to the selection signal terminal S, the selector 102 selects and outputs the signal input to the input terminal 1. Conversely, when a low level selection signal terminal is input to the selection signal terminal S, the selector 102 selects and outputs the signal input to the input terminal 0.

The differential driver 104 receives the output signal of the selector 102, generates a pair of differential signals in response to this, and outputs the same to the transmission line 20 comprised of the pair of signal lines.

The common mode voltage detection circuit 106 detects when the common mode signal is applied to the transmission line 20 and outputs this to the comparator 105.

The comparator 105 outputs a high level selection control signal and inputs it to the selection signal input terminal S of the selector 102 when the output signal from the common mode voltage detection circuit 106 is higher than the predetermined reference voltage Vref and outputs a low level selection control signal and inputs it to the selection signal input terminal S of the selector 102 at other times.

In the output circuit 100 configured as explained above, at the time of normal operation, only the differential signals are present on the transmission line 20 and a low level signal is output from the common mode voltage detection circuit 106, so a low level selection control signal is output from the comparator 105 and input to the selection signal terminal S of the selector 102. In accordance with this, the signal input to the input terminal 0 is selected by the selector 102. That is, the serial transmission data output from the flip-flop 101 is selected by the selector 102 and output to the transmission line 20.

On the other hand, in the receiver unit, when synchronization of the PLL circuit is lost due to some reason or another, the clock recovery circuit 300 of the receiver unit generates a signal requesting the reference clock signal, that is, the common mode signal, and outputs that request signal to the transmission line 20. Receiving this, in the output circuit 100 of the transmitter unit, the common mode voltage detection circuit 106 generates a high level detection signal and outputs it to the comparator 105, so the comparator 105 outputs a high level selection control signal and inputs it to the selection signal terminal S of the selector 102. In accordance with this, the selector 102 selects the signal input to the input terminal 1. That is, the reference clock signal RCK output from the frequency divider 103 is selected by the selector 102 and output to the transmission line 20.

The clock recovery circuit 300, as illustrated, is comprised of a voltage controlled oscillator (VCO) 301, a loop filter 302, a phase detector 303, a differential receiver 304, a frequency detector 305, a frequency divider 306, a timer circuit 307, a differential driver 308, an in-phase driver 309, and a D-type flip-flop 310.

Note that the frequency division ratio of the frequency divider 306 is set in the same way as the frequency division ratio of the frequency division circuit 103 in the transmitter unit. Further, the frequency division ratios of these frequency division circuits may be both set to 1. That is, it is possible to omit these frequency dividers. By providing the frequency dividers 103 and 306 in the transmitter unit and receiver unit, it is possible to reduce the frequency of the reference clock signal RCK and reduce the operating frequency range of the frequency comparison circuit 305 of the receiver unit.

The phase detector 303, the frequency detector 305, the loop filter 302, and the VCO 301 constitute a PLL circuit.

The phase detector 303 compares the phases of the reception signal S4 from the differential receiver 304 and the clock signal LCK from the VCO 301 and, in accordance with the results, generates an oscillation control signal S1 which it outputs to the loop filter 302.

Figure 3:
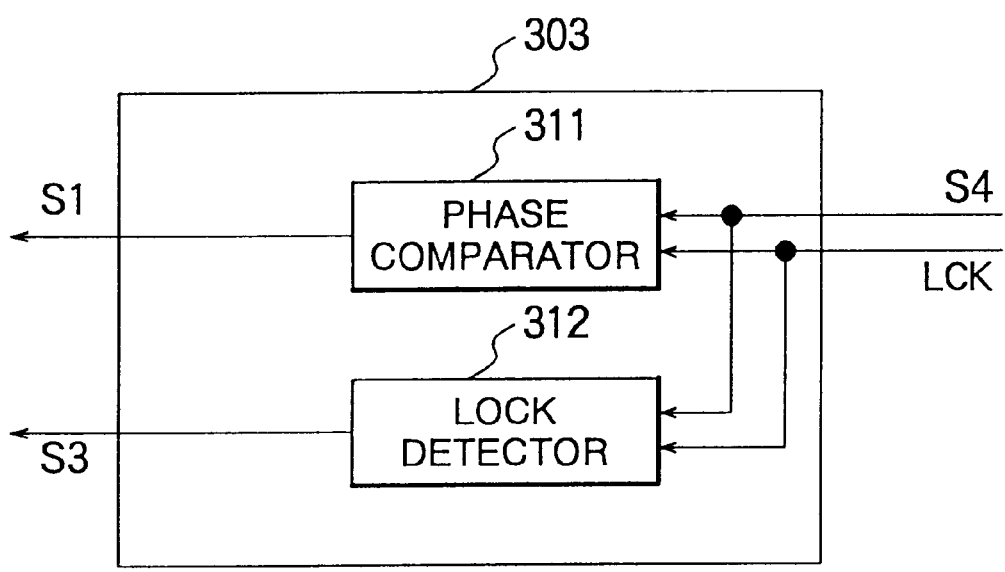
FIG. 3 is a circuit diagram of an example of a phase comparison circuit in first and second embodiments of the present invention.

FIG. 3 is a circuit diagram of an example of the phase detector circuit 303 in first and second embodiments of the present invention. As shown in FIG. 3, the phase detector 303 is comprised of a phase comparator 311 and lock detector 312.

The phase comparator 311 compares the phase of the clock signal LCK generated by the VCO 301 and the phase of the transmission signal of the transmission line 20 and outputs an oscillation control signal S1 in accordance with the result of the comparison.

The lock detector 312 generates a lock detection signal S3 showing the state of synchronization of the clock signal LCK and outputs it to the timer circuit 307.

Note that the lock detector 312 can be provided separately from the phase detector 303.

The frequency detector 305 compares the frequency of the frequency divided signal from the frequency divider 306 and the frequency of the reference clock signal RCK transmitted from the transmission line 20 and outputs the oscillation control signal S2 in accordance with the result.

The loop filter 302 removes the high band component, noise, etc. of the oscillation control signal S1 from the phase comparison circuit 303 and the oscillation control signal S2 from the frequency comparison circuit 305 and outputs just the low band component to the VCO 301.

The VCO 301 receives the oscillation control signal from the loop filter 302 and controls the frequency of the clock signal LCK in accordance with the same.

In the PLL circuit configured in this way, the VCO 301 gives a clock signal LCK having the same frequency as the transmission clock signal TCK used in the transmitter unit. The clock signal LCK is used as the recovered signal of the transmission clock signal TCK for reception of the transmission data or synchronization control of the receiver unit.

At the time of reception, the differential receiver 304 receives the differential signal transmitted from the transmission line 20 and in response to this generates a reception signal S4 which it then outputs to the phase detector 303 and the frequency detector 305.

The phase detector 303 and the frequency detector 305 are equipped with enable functions and are set in the operating/nonoperating state in accordance with the level of an input enable signal. Here, it is assumed that both the phase detector 303 and the frequency detector 305 are "low enabled". That is, they operate only when a low level signal is input to the enable signal terminals and do not operate at other times.

Note that the enable signals ENB1 and ENB2 controlling the operating state of the phase detector 303 and the frequency detector 305 are generated by the differential driver 308. Further, the lock detector 312 in the phase detector 303 is set to the operating state at all times without regard as to the enable signal ENB1 input to the phase comparison circuit 303.

At the time of normal operation, the differential driver 308 generates a low level enable signal ENB1 and a high level enable signal ENB2, so only the phase detector 303 is set to the operating state. The frequency detector 305 is set to the nonoperating state.

In the receiver unit, at the initial state or normal receiving operation, sometimes the frequency of the clock signal LCK generated by the VCO 301 deviates widely from the frequency of the clock signal TCK used in the transmitter unit for some reason or another. At this time, the lock detector 312 provided at the phase detector 303 generates for example a high level lock detection signal showing frequency deviation and outputs it to the timer circuit 307.

The timer circuit 307 generates a synchronization control signal S5 in response to the lock detection signal S3 from the lock detector 312.

For example, the timer circuit 307 generates the synchronization control signal S5 and outputs it to the differential driver 308 and the common mode driver 309 when receiving a high level lock detection signal S3 from the lock detector 312. Note that the synchronization control signal S5 is a pulse signal having a predetermined duration.

Receiving the synchronization control signal S5, the differential driver 308 generates a high level enable signal ENB1 and a low level enable signal ENB2 and output them to the phase detector 303 and the frequency detector 305. Receiving this, the phase detector 303 is set to the nonoperating state and the frequency detector 305 is set to the operating state.

Further, the common mode driver 309 generates an common mode signal and outputs it to the transmission line. Therefore, while the synchronization control signal S5 from the timer circuit 307 is being held at a high level, the common mode driver 309 outputs the common mode signal to the transmission line 20 as a signal requesting the reference clock signal. At this time, the average voltage of the pair of the signal lines constituting the transmission line 20 is held at for example 1 V.

When a synchronization control signal S5 is output to the transmission line 20, at the output circuit 100 of the transmitter unit, a high level detection signal is output from the common mode voltage detection circuit 106, so a high level selection control signal is output from the comparator 105. In accordance with this, a reference clock RCK from the frequency divider 103 is selected by the selector 102 and output through the differential driver 104 to the transmission line 20.

In the clock reproducing circuit 300 of the receiver unit, a received signal S4 synchronized with the reference clock RCK is output by the differential receiver 304. This signal is input to the frequency detector 305 set to the operating state by the low level enable signal ENB2. Further, the clock signal LCK output from the VCO 301 is divided by N by the frequency divider 306 and the divided signal input to the frequency comparison circuit 305 as well.

The frequency detector 305 compares the frequencies of the reception signal S4 and the divided signal of the frequency divider 306 and in accordance with the result of the comparison generates an oscillation control signal S2 which is output to the loop filter 302. The loop filter 302 removes the high band component, noise, etc. of the oscillation control signal S2 from the frequency comparison circuit 305 and outputs just the low band component to the VCO 301.

The VCO 301 controls the frequency of the clock signal LCK in accordance with the oscillation control signal from the loop filter 302.

Due to this control, the oscillation frequency of the VCO 301 is controlled so that the divided signal from the frequency division circuit 306 and the reference clock RCK match in frequency, so the frequency of the clock signal LCK generated by the VCO 301 matches the frequency of the transmission clock signal TCK used for the transmitter unit.

When the frequencies match, the lock detector 312 provided in the phase detector 303 generates a low level lock detection signal S3 and outputs it to the timer circuit 307. In accordance with this, the timer circuit 307 outputs a low level common mode control signal S5, so the generation of the common mode signal by the common mode driver 309 is stopped. Due to this, the common mode voltage detection circuit 106 of the transmitter unit outputs a low level detection signal. The comparator 105 generates a low level selection control signal which is then input to the selection signal terminal S of the selector 102.

As a result, the selector 102 switches the signal output to the transmission line 20 from reference clock signal RCK to the transmission data SDAT.

In the clock recovery circuit 300 of the receiver unit, the differential driver 308 generates a low level enable signal ENB1 and a high level enable signal ENB2. These are output to the phase detector 303 and the frequency detector 305. Due to this, the frequency detector 305 is switched to the nonoperating state and the phase detector 303 is switched to the operating state.

That is, when the frequency of the clock signal LCK generated from the VCO 301 matches with the frequency of the transmission clock signal TCK used in the transmitter unit, the PLL circuit constituted by the phase detector 303, loop filter 302, and VCO 301 operate and control is performed so that the clock signal LCK generated by the VCO 301 matches the phase of the received signal S4 output from the differential driver 304.

Further, the flip-flop 310 successively outputs the data SDAT transmitted from the transmission line 20 in accordance with the timing of the clock signal LCK generated from the VCO 301. The output data SDAT of the flip-flop 310 is converted to for example n bits of data by the serial/parallel conversion circuit in the receiver unit and output.

Due to the above operation, data transmitted from the transmitter unit is received accurately by the receiver unit. When the frequency of the clock signal LCK of the receiver unit 30 deviates from the frequency of the transmission clock signal TCK used for the transmitter unit due to noise or other factors at the time of initialization or during normal data transmission, the clock recovery circuit 300 outputs an common mode signal requesting transmission of the reference clock signal RCK to the transmission line 20. In the output circuit 100 of the transmitter unit, the common mode signal, that is the reference clock request signal, is detected and, in accordance with this, the transmission signal is switched to the reference clock signal RCK which is then output to the transmission line 20.

In the receiver unit, the PLL circuit comprised of the frequency detector 305, loop filter 302, and VCO 301 controls the oscillation frequency until the frequency of the divided signal from the frequency divider 306 and the frequency of the reference clock signal RCK match. When the frequencies match, the generation of the reference clock signal RCK is stopped, the transmission signal is switched to the normal transmission data at the transmitter unit, and, simultaneously, at the clock recovery circuit 300, the PLL circuit comprised of the phase detector 303, loop filter 302, and VCO 301 generates a clock signal of the same frequency as the transmission clock signal TCK used in the transmitter unit. Based on this, the data transmitted from the transmission line 20 is received.

As explained above, according to this embodiment, at times of ordinary transmission of data, the selector 102 of the output circuit 100 selects the transmission data SDAT and outputs it through the differential driver 104 to the transmission line 20. The phase detector 303 of the clock recovery circuit 300 controls the phase of the clock signal LCK generated by the VCO 301 so that the frequency of the clock signal LCK and the frequency of the received signal S4 match. When the clock signal LCK and the received signal S4 deviate in frequency, a detection signal S3 showing this is issued and a reference clock request signal of the same phase is output to the transmission line 20. The selector 102 selects the reference clock signal RCK and outputs it to the transmission line 20 and the frequency comparison circuit 305 controls the clock signal LCK generated by the VCO 301 so that the output signal of the frequency divider 306 and the reference clock signal RCK match in frequency. Therefore, it is possible to handle a wide range of transfer rates, enable the PLL circuit to lock with the transmission clock quickly, and realize an effective clock reproducing circuit by a simple circuit configuration without having to increase the number of transmission media.

Figure 4:
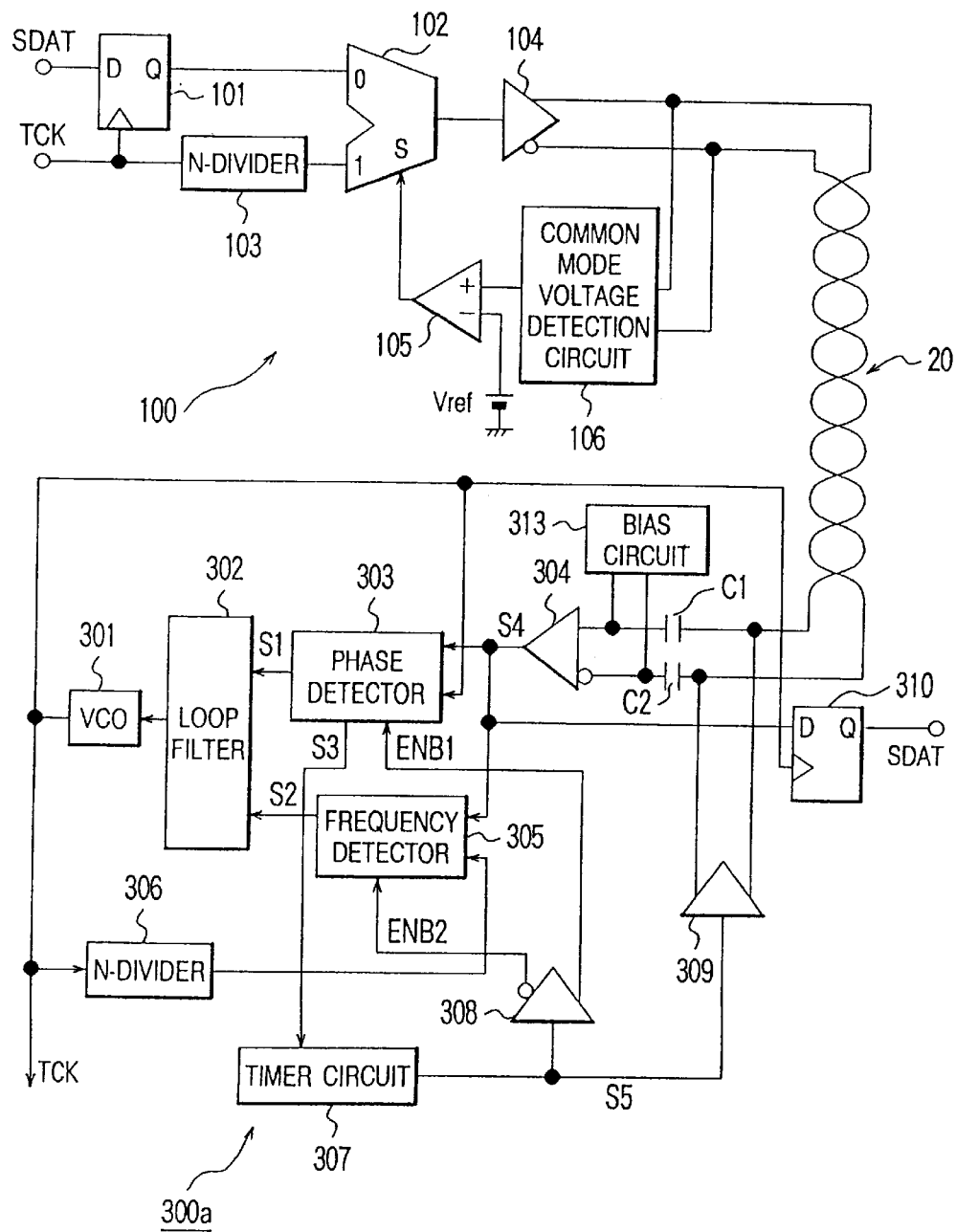
FIG. 4 is a circuit diagram of a data transmission apparatus according to a second embodiment of the present invention.

FIG. 4 is a circuit diagram of a data transmission apparatus according to a second embodiment of the present invention.

Comparing this embodiment with the first embodiment of the present invention shown in FIG. 2, it is understood that it differs at the input side of the differential receiver 304 in the clock recovery circuit 300a of the receiver unit. The rest of the portions of this embodiment are the same as in the first embodiment shown in FIG. 2. FIG. 4 therefore shows the same components of the circuit by the same reference numerals.

As shown in FIG. 4, a capacitor C1 is connected between the non-inverted input terminal of the differential receiver 304 and one of the signal lines of the transmission line 20, while a capacitor C2 is connected between the inverted input terminal and other signal line of the transmission line 20. A bias circuit 313 is connected to the input terminal of the differential receiver 304.

The bias circuit 313 supplies a bias voltage to the differential receiver 304 and sets an operating point of the differential receiver 304.

At the time of normal data transmission, the differential signal based on the transmission data is transmitted at a high speed to the transmission line 20. The data transmission rate is for example 100 MHz to 2 GHz. When the frequency of the clock signal LCK generated by the clock recovery circuit 300a in the receiver unit deviates from the frequency of the transmission clock signal TCK, a common mode signal requesting transmission of the reference clock signal RCK from the transmitter unit is transmitted to the transmission line 20. This common mode signal is held at a certain level for a certain time and deemed to be a DC signal.

The capacitors C1 and C2 block the DC components at the differential receiver 304 and the transmission line 20. Only the AC components of the transmission data transmitted from the transmission line 20 passes through the capacitors C1 and C2 for combination at the differential receiver 304. When a common mode reference clock request signal is input to the transmission line 20, further, this is blocked by the capacitors C1 and C2 and not input to the differential receiver 304.

In this way, due to the capacitors C1 and C2, only the differential signal based on the transmission data of the transmission line 20 is input to the differential receiver 304. The reference clock request signal and other DC components are blocked. For example, when transmitting data using a long transmission line 20, the transmitter unit and receiver unit are driven by respectively independent power supplies, but the differential receiver 304 of the receiver unit is biased by the bias circuit 313 to the optimal operating point based on the power source voltage given to the differential receiver 304.

As explained above, according to this embodiment, AC coupling capacitors C1 and C2 are provided between the input terminals of the differential receiver 304 and transmission line 20 at the receiver unit. Only the high speed differential signal based on the transmission data is input to the differential receiver 304. The DC components are blocked. Therefore, the transmitter unit and the receiver unit are driven by separate power supplies and the differential receiver 304 may be set to the optimal operating point by the bias circuit 313.

Note that in the first and second embodiments explained above, use may be made of a frequency phase detector instead of the frequency detector 305 in the clock recovery circuits 300 and 300a of the receiver unit.

As explained above, according to the data transmission apparatus of the present invention, the circuit configuration can be simplified, the space taken by the transmission line reduced, a wide range of data transmission rates can be dealt with, and high speed data transmission and transmission of a reference clock request signal realized by a simple circuit configuration.

While the invention has been described by reference to specific embodiments chosen for purposes of illustration, it should be apparent that numerous modifications could be made thereto by those skilled in the art without departing from the basic concept and scope of the invention.

What is claimed is:

1. A data transmission apparatus for transmitting transmission data through a transmission line from a transmitter unit to a receiving unit at a transfer rate set by a transmission clock signal, recovering the transmission clock signal at the receiving unit based on the received signal, and receiving said transmission data, comprising:

said transmission line comprises a pair of signal lines;

said transmitter unit has an output circuit which converts said transmission data to a pair of complementary signals, outputs them to said transmission line, and outputs a reference clock signal to said transmission line instead of said transmission data in response to a request signal from said receiving unit transmitted over said transmission line; and said receiving unit has a clock recovery circuit for generating a recovered clock signal in response to said reference clock signal or transmission data transmitted over said transmission line, and a request signal output circuit for outputting said request signal to said transmission line as a common mode signal in accordance with a result of comparison of a frequency of the recovered clock signal generated by said clock recovery circuit and said reference clock signal frequency.

2. A data transmission apparatus as set forth in claim 1, wherein said output of the transmitter unit further comprises:

a detection circuit for generating a selection control signal in accordance with the signal transmitted over said transmission line; and a selection circuit for selecting one of said transmission data and said reference clock signal in accordance with said selection control signal.

3. A data transmission apparatus as set forth in claim 2, wherein said detection circuit makes said selection circuit select and output said transmission data when a synchronization signal is not being transmitted over said transmission line, and makes said selection circuit select and output said reference clock signal when a synchronization signal is being transmitted over said transmission line.

4. A data transmission apparatus as set forth in claim 2, wherein said transmitter unit has a differential drive circuit for converting the selected signal to a differential signal and outputting it to said transmission line at the output side of said selection circuit.

5. A data transmission apparatus as set forth in claim 1, wherein said transmitter unit has a data output circuit for successively outputting said transmission data to said selection circuit at a frequency set by said transmission clock signal.

6. A data transmission apparatus as set forth in claim 1, wherein said transmitter unit has a frequency division circuit for dividing said transmission clock signal in frequency to generate said reference clock signal.

7. A data transmission apparatus as set forth in claim 1, wherein said clock recovery circuit has a second frequency division circuit for dividing the generated clock signal in frequency.

8. A data transmission apparatus as set forth in claim 7, wherein the frequency division ratio of said second frequency division circuit is the same as the frequency division ratio of the frequency division circuit of said transmitter unit.

9. A data transmission apparatus as set forth in claim 1, wherein said receiver unit has a differential receiving circuit for outputting a received signal in accordance with the differential signal transmitted over said transmission line.

10. A data transmission apparatus as set forth in claim 9, wherein said receiver unit has a capacitor for blocking a DC component and allowing passing of only an AC component based on the differential signal of said transmission data between an input terminal of said differential receiving circuit and said transmission line.

11. A data transmission apparatus as set forth in claim 9, wherein said receiver unit has a bias circuit for setting an operating point of said differential receiving circuit.

12. A data transmission apparatus as set forth in claim 1, wherein said clock recovery circuit at said receiving unit has a lock detecting circuit for detecting deviation of frequency between the recovered clock signal and said received signal.

13. A data transmission apparatus as set forth in claim 12, wherein said lock detecting circuit outputs a detection signal indicating that said recovered clock signal is not synchronous when the frequencies of the clock signal generated by said clock recovery circuit and said received signal differ.

14. A data transmission apparatus as set forth in claim 12, wherein said receiver unit has a synchronization control circuit for outputting a synchronization control signal having a predetermined duration when a detection signal is received from said lock detecting circuit.

15. A data transmission apparatus as set forth in claim 14, wherein said synchronization control circuit is comprised of a timer.

16. A data transmission apparatus as set forth in claim 14, wherein said receiver unit has a common mode drive circuit for receiving said synchronization control signal and outputting a common mode signal to said transmission line.

17. A data transmission apparatus as set forth in claim 1, wherein said clock recovery circuit is comprised of a PLL circuit comprised of a phase comparator, a filter, and a voltage controlled oscillator.

18. A data transmission apparatus as set forth in claim 17, wherein said receiver unit has an operation control circuit for receiving said synchronization control signal and stopping the operation of said phase comparator constituting said PLL circuit.

19. A data transmission apparatus as set forth in claim 1, wherein said clock recovery circuit has a frequency comparator for comparing the frequencies of the frequency division signal from said frequency divider and said received signal and outputs a signal for controlling the oscillation frequency of said voltage controlled oscillator in accordance with the results of the comparison and is set to an idle state when said phase comparator is operating.

20. A data transmission apparatus as set forth in claim 19, wherein said operation control circuit receives said synchronization circuit and switches said frequency comparator from the idle state to an operating state.

21. A data transmission apparatus for transmitting transmission data through a transmission line from a transmitter unit to a receiving unit at a transfer rate set by a transmission clock signal, recovering the transmission clock signal at the receiving unit based on the received signal, and receiving said transmission data, comprising:

said transmission line comprises a pair of signal lines;

said transmitter unit has an output circuit which converts said transmission data to a pair of complementary signals, outputs them to said transmission line, and outputs a reference clock signal to said transmission line instead of said transmission data in response to a request signal from said receiving unit transmitted over said transmission line;

said receiving unit has a clock recovery circuit for generating a recovered clock signal in response to said reference clock signal or transmission data transmitted over said transmission line, and a request signal output circuit for outputting said request signal to said transmission line as a common mode signal in accordance with a result of comparison of a frequency of the recovered clock signal generated by said clock recovery circuit and said reference clock signal frequency;

a detection circuit for generating a selection control signal in accordance with the signal transmitted over said transmission line;

a selection circuit for selecting one of said transmission data and said reference clock signal in accordance with said selection control signal; wherein said transmitter unit has a differential drive circuit for converting the selected signal to a differential signal and outputting it to said transmission line at the at the output side of said detection circuit; and said detection circuit makes said selection circuit select and output said transmission data when a synchronization signal is not being transmitted over said transmission line and makes said selection circuit select and output said reference clock signal when a synchronization signal is being transmitted over said transmission line.

\* \* \* \* \*

UNITED STATES PATENT AND TRADEMARK OFFICE
CERTIFICATE OF CORRECTION

PATENT NO.    : 6,069,927
DATED         : May 30, 2000
INVENTOR(S)   : Hidekazu Kikuchi It is certified that error appears in the above-identified patent and that said Letters Patent is hereby corrected as shown below:

<u>Column 10, claim 2,</u>
Line 11, insert -- circuit -- after "output".

<u>Column 12, claim 21,</u>
Line 28, delete "at the" second occurrence.

Signed and Sealed this

Twenty-sixth Day of February, 2002

Attest:

JAMES E. ROGAN
*Attesting Officer*     *Director of the United States Patent and Trademark Office*